US007280369B2

(12) United States Patent
Tsai

(10) Patent No.: US 7,280,369 B2
(45) Date of Patent: Oct. 9, 2007

(54) MULTI-LAYER PRINTED CIRCUIT BOARD FOR A KEYBOARD

(76) Inventor: Huo-Lu Tsai, No. 188-1, Jhongjheng Rd., Shangfeng Village, Daya Hsiang, Taichung Hsien (TW)

( * ) Notice: Subject to any disclaimer, the term of this patent is extended or adjusted under 35 U.S.C. 154(b) by 6 days.

(21) Appl. No.: 11/333,690

(22) Filed: Jan. 17, 2006

(65) Prior Publication Data

US 2007/0165387 A1 Jul. 19, 2007

(51) Int. Cl.
*H05K 7/00* (2006.01)

(52) U.S. Cl. ....................................... 361/760; 361/792

(58) Field of Classification Search ................ 361/760, 361/792, 758, 770, 781, 795

See application file for complete search history.

(56) References Cited

U.S. PATENT DOCUMENTS 4,679,025 A * 7/1987 Ohashi ........................ 338/197
5,177,330 A * 1/1993 Takahashi et al. .......... 200/5 A
5,542,676 A * 8/1996 Howe et al. ................ 473/202
5,786,986 A 7/1998 Bregman et al. ........... 361/719
6,388,208 B1 5/2002 Kiani et al. ................. 174/266
6,614,663 B1 9/2003 Yokota et al. .............. 361/780
6,646,886 B1 * 11/2003 Popovich et al. ........... 361/748
2006/0144211 A1 * 7/2006 Yoshimoto ................... 84/615
2007/0002156 A1 * 1/2007 Hagood et al. ............. 348/296

FOREIGN PATENT DOCUMENTS

JP 04-253392 * 9/1992
JP 08-155080 * 6/1996

* cited by examiner

*Primary Examiner*—Michael C. Zarroli
(74) *Attorney, Agent, or Firm*—Alan Kamrath; Kamrath & Associates PA

(57) ABSTRACT

A multi-layer printed circuit board for a keyboard has an upper and lower layers, an insolating separation positioned between the upper and lower layers, multiple thin film switches having two thin conductive element respectively formed on the upper and lower layer, and multiple spacers positioned between one of the upper and lower layer and the insolating layer. Since each spacer can be selectively formed on the upper layer, lower layer or insolating separation and corresponds to one of the through holes in the insolating separation, the spacers increase a distance between the two thin conductive elements of each thin film switch. Therefore, the sensitivity of touch of the multi-layer PCB can be adjusted by different arrangements of the spacers.

14 Claims, 8 Drawing Sheets

MULTI-LAYER PRINTED CIRCUIT BOARD FOR A KEYBOARD

BACKGROUND OF THE INVENTION

1. Field of the Invention

The present invention relates to a multi-layer printed circuit board (PCB) and more particularly to a multi-layer PCB for a keyboard.

2. Description of Related Art

A keyboard includes a base having an upper opening, a top cover, a printed circuit board (PCB), and multiple keys. The multiple keys are mounted on the top cover and the top cover is mounted over the upper opening of the base. The PCB is mounted in the base and has multiple thin film switches corresponding to the multiple keys on the top cover. Therefore, when one key is pressed, the pressed key will touch the corresponding thin film switch on the PCB, and then the PCB will output an electronic signal to a computer connected to the keyboard.

With reference to FIG. 8, a conventional dual-layer PCB of the keyboard has an upper board (10), an insulating separation layer (30) and a lower board (20). The upper board (10) and the lower board (20) have multiple circuit lines (12, 13) (22, 23). The insulating separation layer (30) is positioned between the upper and lower boards (10, 20) and has multiple through holes (31).

Multiple thin film switches are mounted between the upper board (10) and the lower board (20), but only one thin film switch is shown in FIG. 8. Each thin film switch includes two thin conductive elements (50, 60) respectively formed on the upper and lower boards (10, 20). The two thin conductive elements (50, 60) are aligned with one of the through holes (31), and each is formed as a metal sheet. The two thin conductive elements (50, 60) are respectively connected to the circuit lines (12, 13)(22, 23).

The two thin conductive elements (50, 60) are separated by the insulting insulating separation layer (30) and aligned with the corresponding through hole (31). When one key on the top cover of the keyboard is pressed, the two thin conductive elements (50, 60) corresponding to the pressed key touch with each other and are connected electrically through the through hole (31) in the insulating separation layer (30). When the force applied to the key is released, the two thin conductive elements (50, 60) are disconnected electrically. Therefore, a thickness of the insulating separation layer (30) determines the sensitivity of touching a key. Many types of keyboards having different sensitivity of touch are produced, since the insulating separations with different thickness are used in the PCBs of the keyboards. Accordingly, the factory for fabricating the multi-layer PCB has to prepare many different insulating separation layers to fabricate the keyboards having different sensitivity of touch.

Further, since the thin conductive elements (50, 60) are formed on the upper and lower boards (10, 20), exposure surfaces of the thin conductive elements (50, 60) are easily shrunk to form to an uneven face in a curing procedure of fabricating the upper and lower boards (10, 20). Thus, the uneven faces decrease a touching area of the thin conductive elements (50, 60) to make the sensitivity of the thin film switch poor.

Therefore, the present invention provides a multi-layer PCB for a keyboard to overcome the drawback of the conventional multi-layer PCB.

SUMMARY OF THE INVENTION

The main objective of the present invention is to provide a multi-layer printed circuit board (PCB) for a keyboard.

A multi-layer printed circuit board of a keyboard has an upper layer, a lower layer, an insulating separation positioned between the upper and lower layers, multiple thin film switches having two thin conductive elements formed respectively on the upper and lower layer, and multiple spacers positioned between one of the upper and lower layer and the insulating separation layer. Since each spacer can be selectively formed on the upper layer, lower layer or insulating separation layer and corresponds to the through holes of the insulating separation layer, the spacers increase a distance between the two thin conductive elements of each thin film switch. Therefore, sensitivity of touch of the multi-layer PCB can be adjusted by different arrangements of the spacers.

The second objective of the present invention is to provide a thin film switch of the PCB of a keyboard having a stable touch sensitivity.

Each thin conductive element of the each thin film switch has a center conductor, at least two outer conductors formed adjacent to the center conductor, and at least two conductive lines connected to the center and outer conductors. With such an arrangement, the area of the center and outer conductors will be reduced, surfaces of the conductors are even in the curing procedure of fabricating upper or lower board to keep a stable touching sensitivity.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
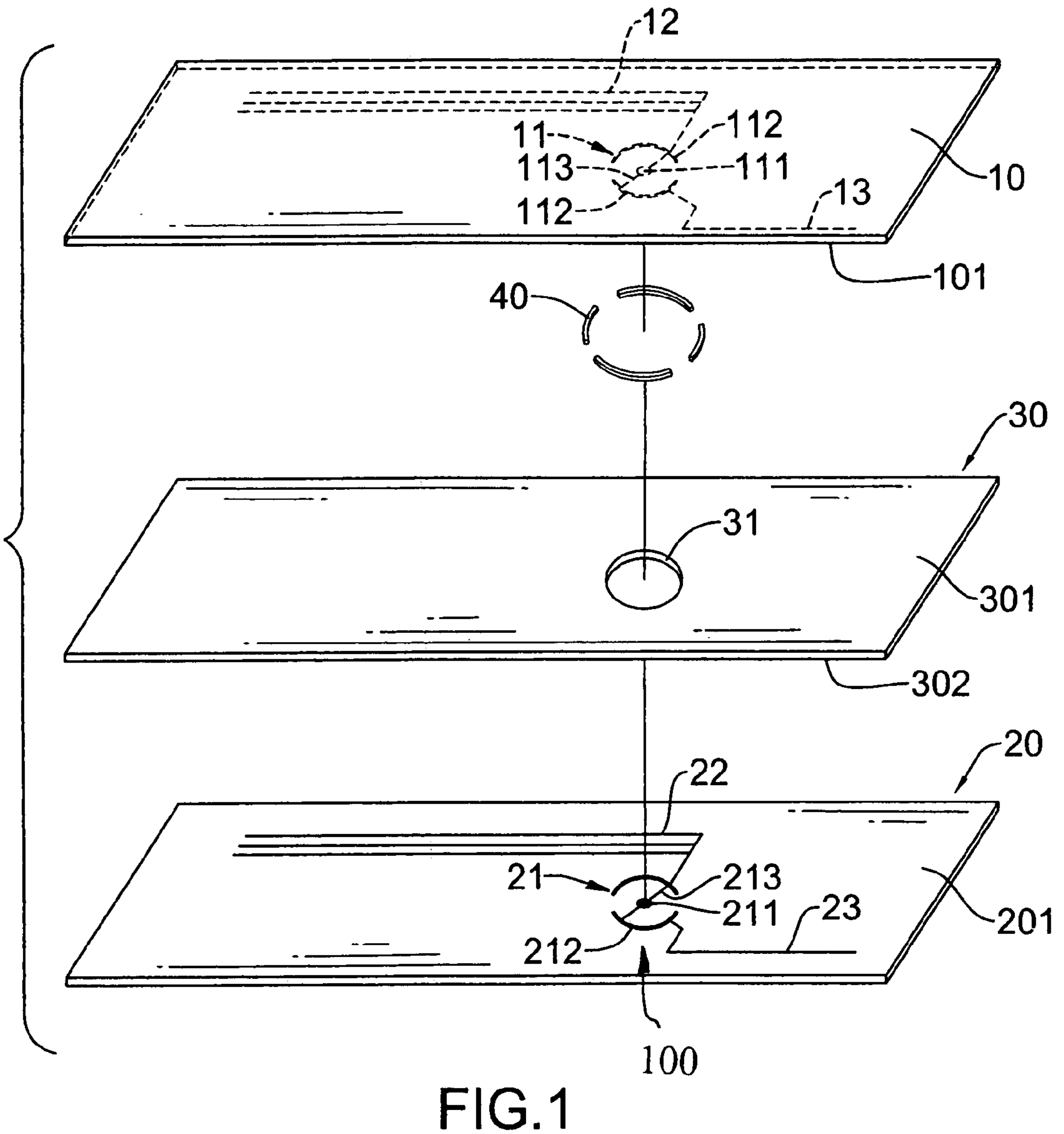
FIG. 1 is an exploded perspective view of a first embodiment of a multi-layer printed circuit board (PCB) in according with the present invention.

With reference to FIG. 1, a multi-layer printed circuit board in accordance with the present invention has an upper layer (10), an insulating separation layer (30), a lower layer (20), multiple thin film switches (100) and multiple spacers (40). To simplify the drawings, only one thin film switch (100) and spacer (40) are shown in the drawings.

The upper and lower layers (10, 20) respectively have multiple circuit lines (12, 13) (22,23). The upper layer (10) has a bottom (101), and the lower layer (20) has a top (201).

The insulating separation layer (30) is positioned between the upper and lower layers (10, 20), defines multiple through holes (31) and has opposite top and bottom sides (301, 302).

Each thin film switch (100) has two thin conductive elements (11, 21) formed respectively on the upper and lower layer (10, 20). The two thin conductive elements (11, 21) are aligned with one of the through holes (31) in the insulating separation layer (30).

The multiple spacers (40) are positioned between one of the upper and lower layers (10, 20) and the in insulating separation layer (30), and correspond respectively to the through holes (31) in the insulating separation layer (30).

Figure 2:
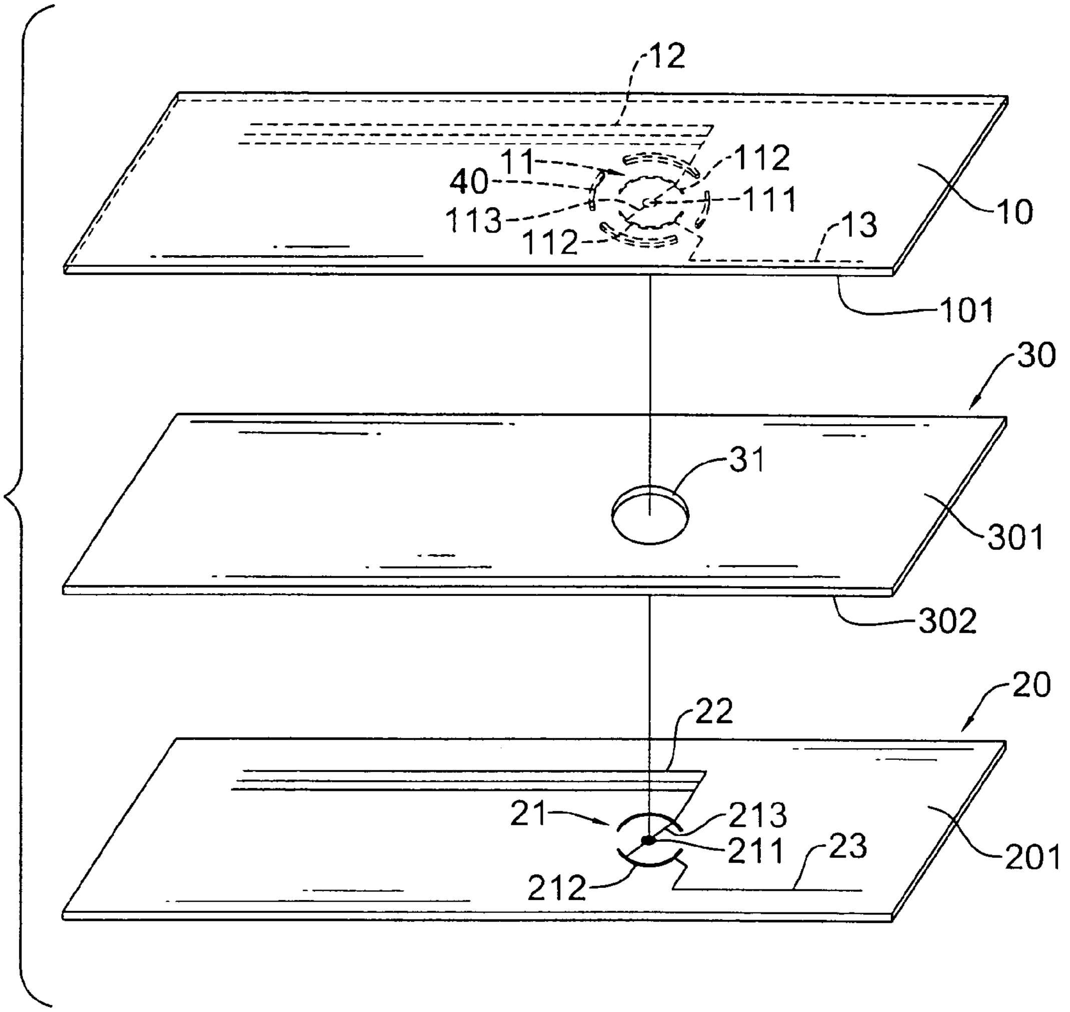
FIG. 2 is an exploded perspective view of an alternative embodiment of the multi-layer printed circuit board (PCB) in FIG. 1, wherein a spacer is directly formed on an upper layer of the PCB in according with the present invention.

In the first embodiment, with reference to FIG. 1, the spacers (40) are positioned between the upper layer (10) and the insulating separation layer (30). With further reference to FIG. 2, the spacers (40) are directly formed on the bottom (101) of the upper layer (10) or on the top side (301) of the insulating separation layer (30) around the through holes (31).

Figure 3:
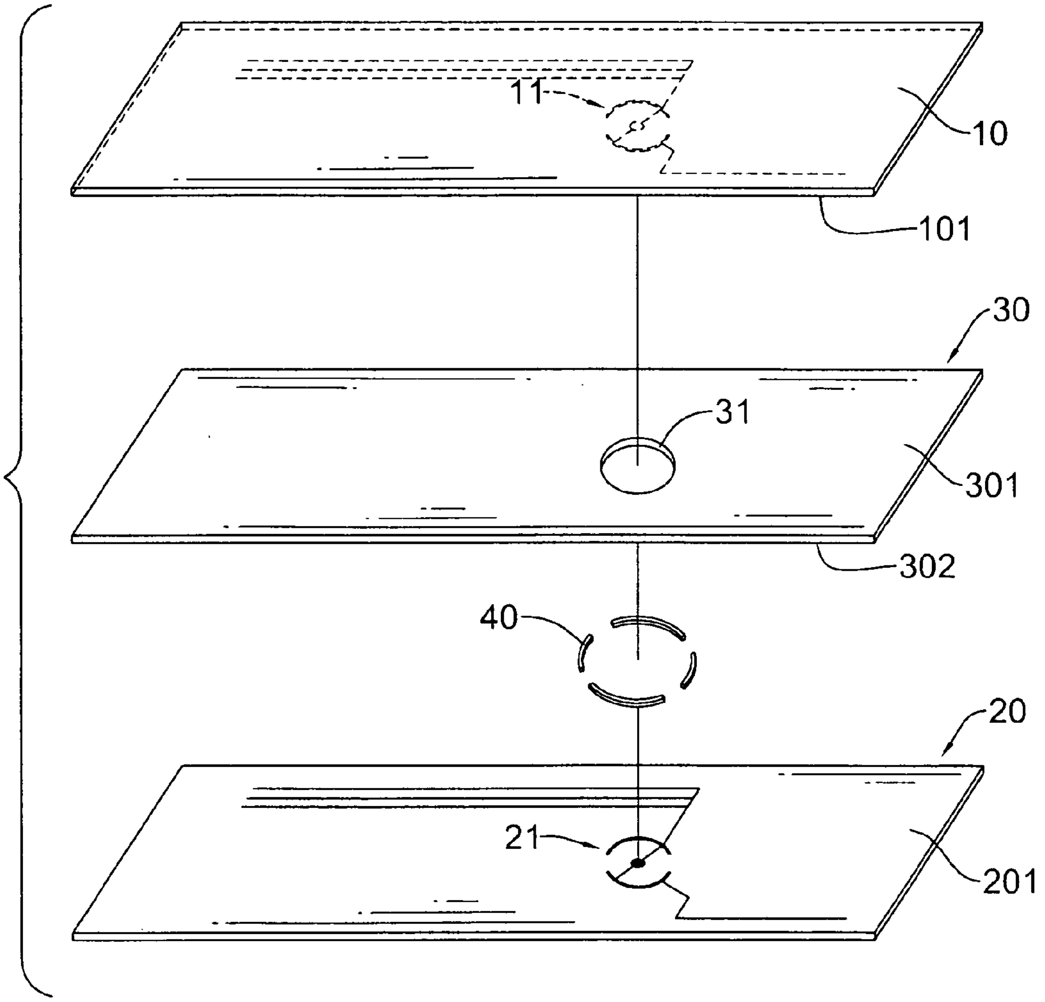
FIG. 3 is an exploded perspective view of a second embodiment of a multi-layer printed circuit board (PCB) in according with the present invention.
Figure 4:
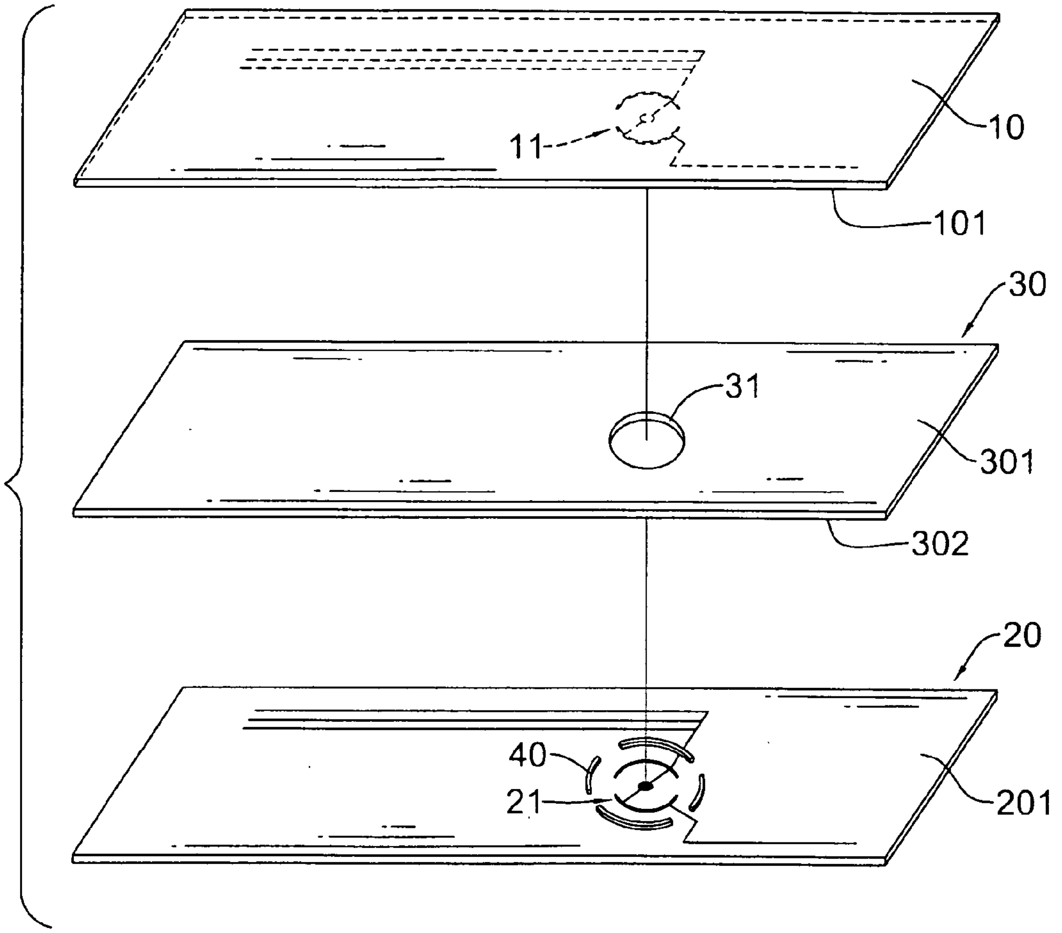
FIG. 4 is an exploded perspective view of an alternative embodiment of the multi-layer printed circuit board (PCB) in FIG. 3, wherein a spacer is directly formed on a lower layer of the PCB in according with the present invention.

With reference to FIG. 3, the multiple spacers (40) are positioned between the bottom side (302) of the insulating separation layer (30) and the top 201 of the lower layer (20). Therefore, the spacers (40) can be formed on the bottom side (302) and respectively around the through holes (31), or formed on the top (201) of the lower layer (20), as shown in FIG. 4.

Figure 5:
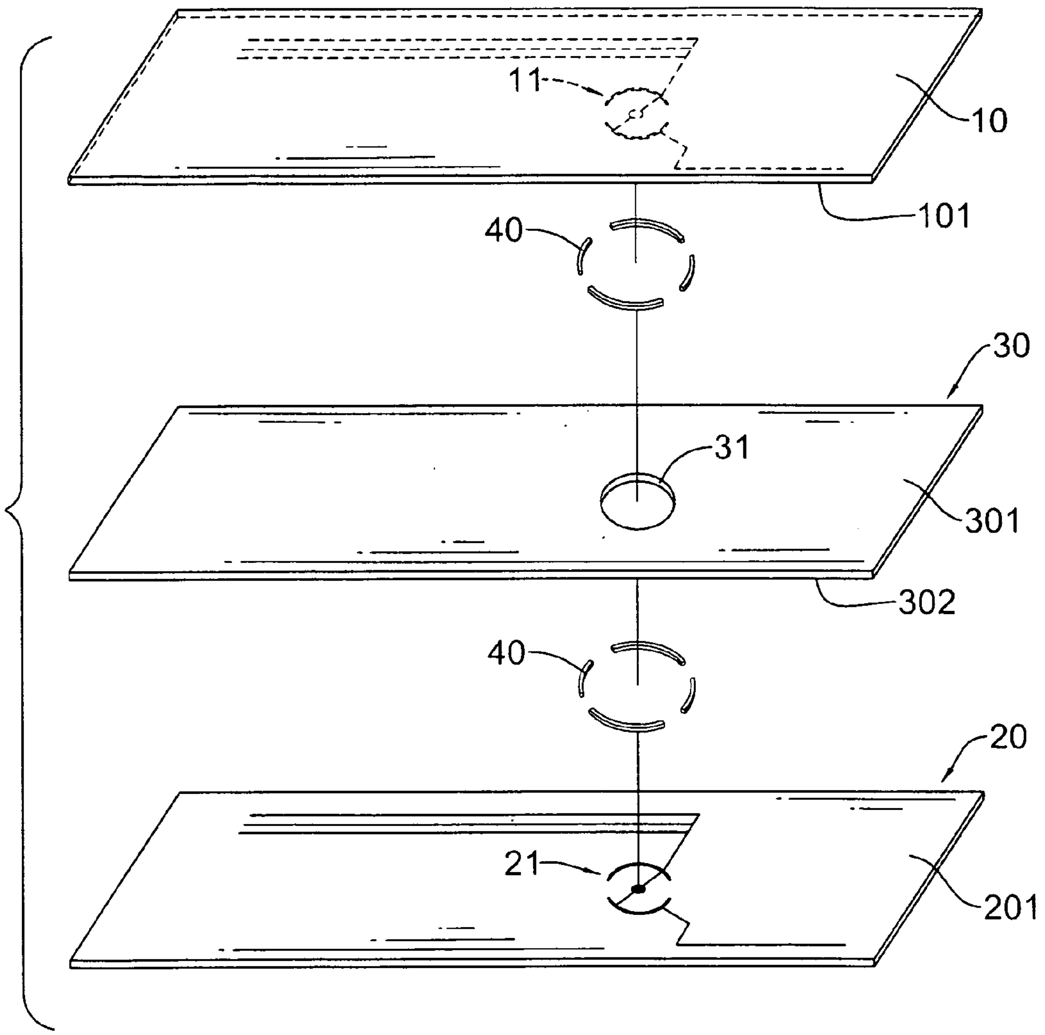
FIG. 5 is an exploded perspective view of a third embodiment of a multi-layer printed circuit board (PCB) in according with the present invention.
Figure 6:
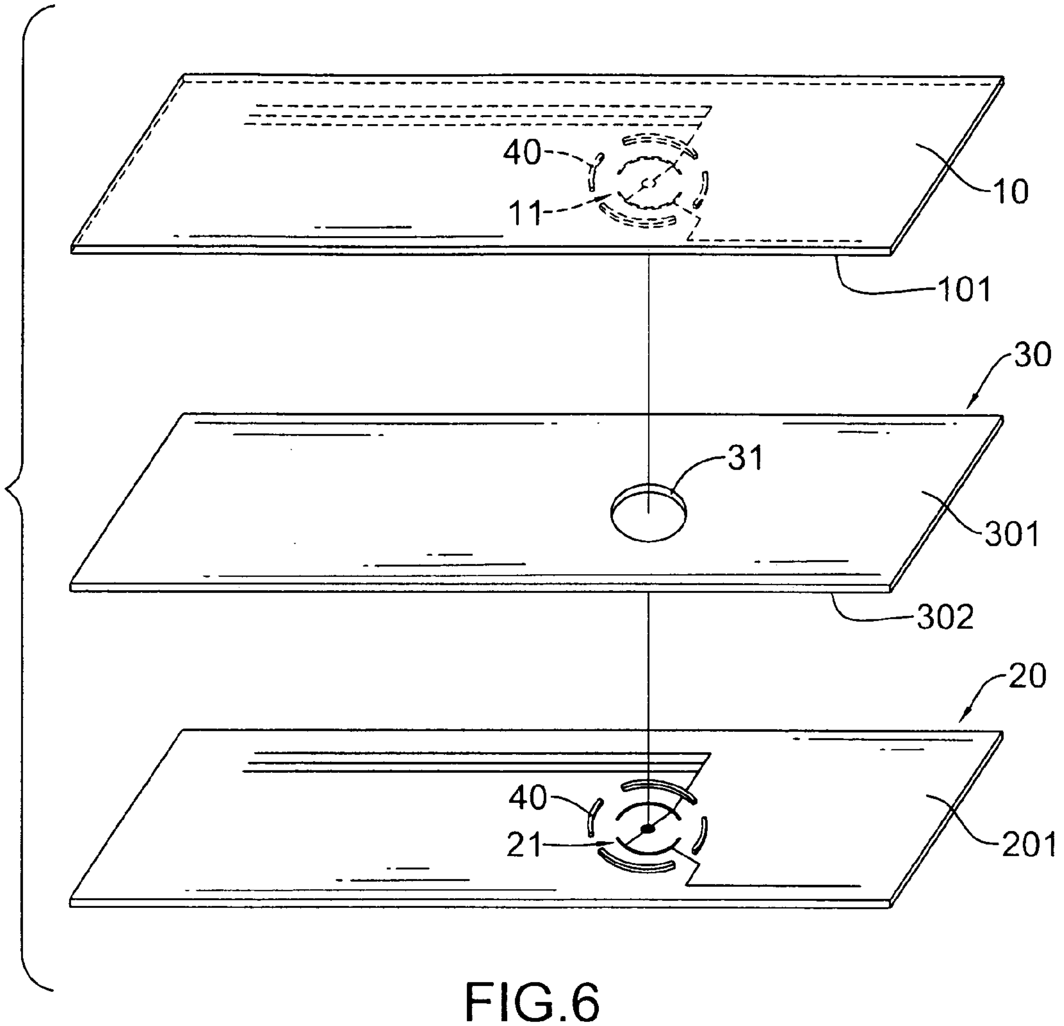
FIG. 6 is an exploded perspective view of an alternative embodiment of the multi-layer printed circuit board (PCB) in FIG. 5, wherein two spacers are respectively formed on a upper and lower layers of the PCB in according with the present invention.
Figure 7:
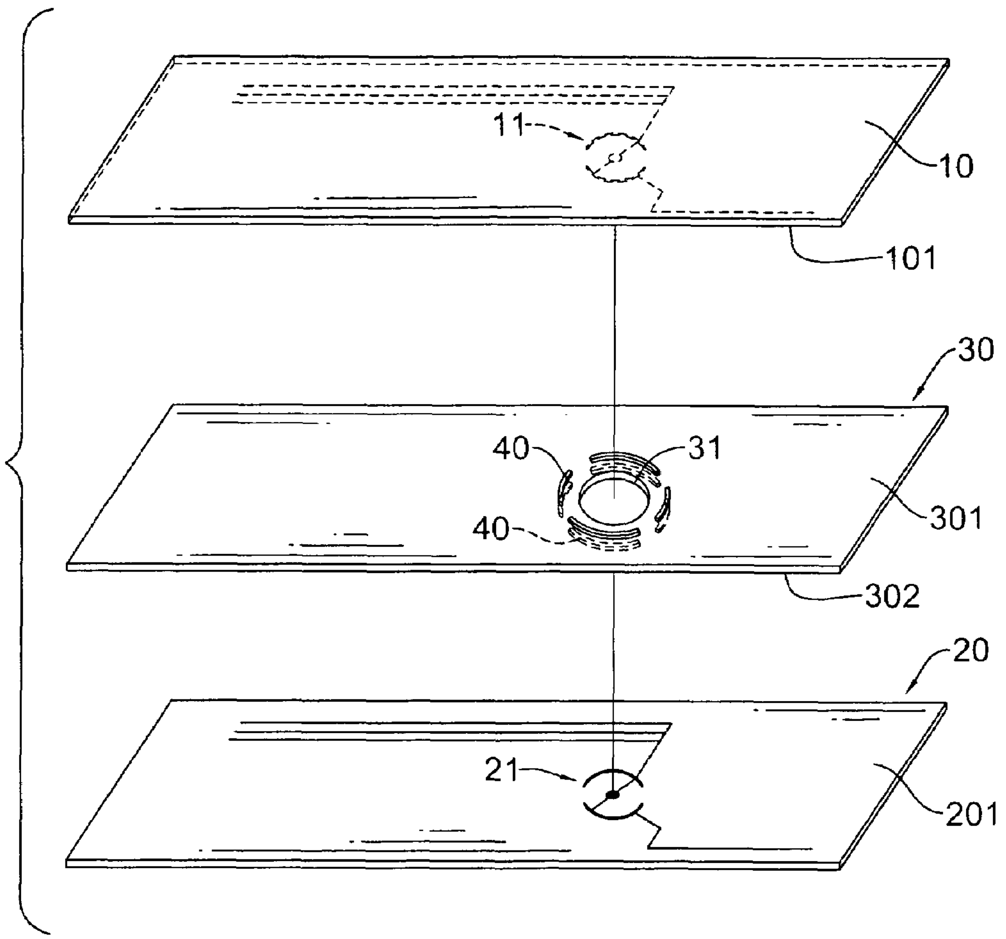
FIG. 7 is an exploded perspective view of a fourth embodiment of a multi-layer printed circuit board (PCB) in accordance with the present invention, wherein two spacers are formed on two opposite sides of an insulating separation layer of the PCB.
Figure 8:
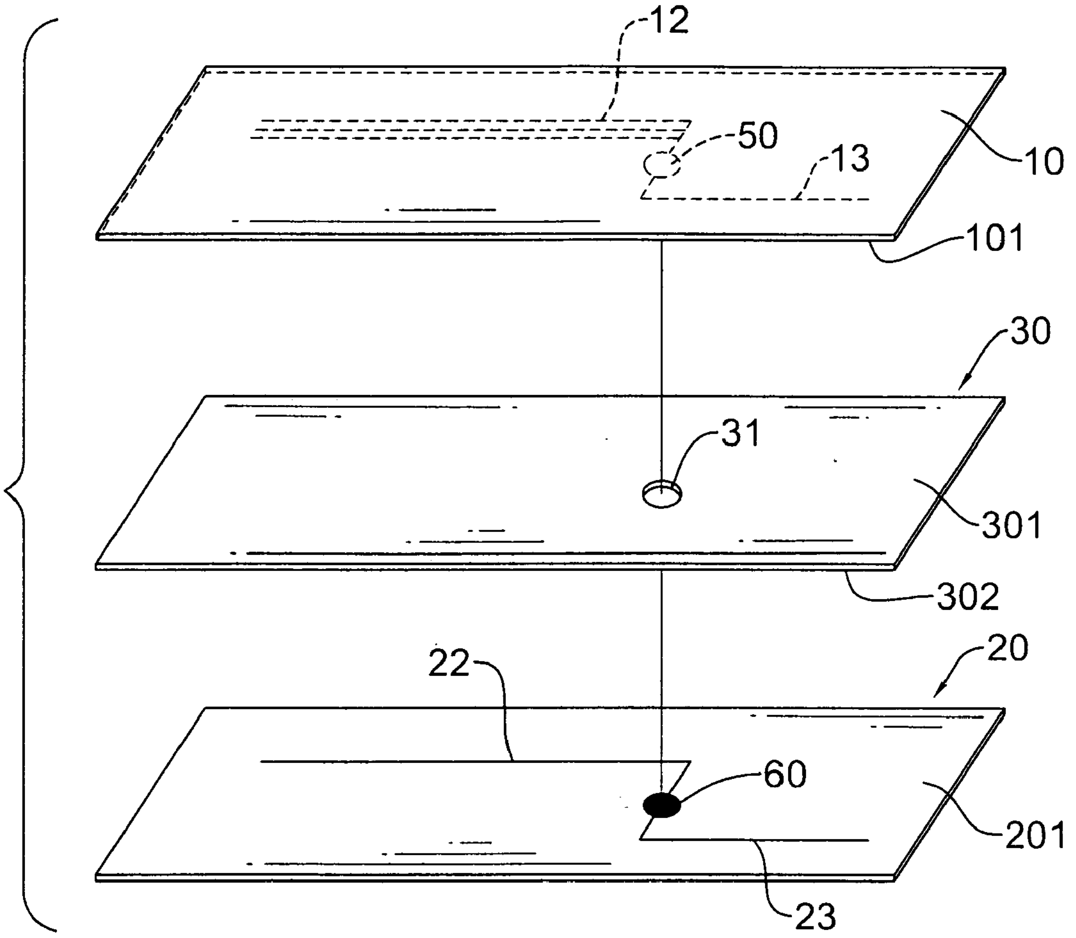
FIG.8 PRIOR ART
FIG. 8 is an exploded perspective view of a conventional printed circuit board in according with the prior art.

With reference to FIG. 5, the multiple spacers (40) are positioned among the upper layer (10), the insulating separation layer (30) and the lower layer (20). With further reference to FIG. 6, the multiple spacers (40) are formed on the bottom (101) of the upper layer (10) and the top (201) of the lower layer (20). With reference to FIG. 7, the multiple spacers (40) are formed on the opposite top and bottom sides (301, 302) of the insulating separation layer (30).

Each spacer (40) can comprise multiple curved protrusions. The multiple curved protrusions are arranged in a circular shape.

Furthermore, to provide a stable touching sensitivity to the PCB, with reference to FIG. 1, each thin conductive element (11, 21) has a center conductor (111, 211), at least two outer conductors (112, 212) and at least two conductive lines (113, 213).

The center conductor (111, 211) is aligned with the corresponding through hole (31) in the insulating separation layer (30).

The at least two outer conductors (112, 212) are symmetrically formed adjacent to the center conductor (111, 211) and also aligned with the corresponding through hole (31). Each outer conductor (112, 212) is further connected to the circuit lines (12, 13) (22, 23) of the upper or lower layer (10, 20).

The at least two conductive lines (113, 213) are respectively connected to the outer conductors (112, 212) and are connected to the center conductor (111, 211).

Based on the forgoing description, the multi-layer PCB in accordance with the present invention uses the spacers (40) to increase a distance between thin conductive elements (11, 21) of each thin film switch (100) of PCB to fabricate different senses of touch of the PCB keyboard.

The center conductor (111, 211) is formed of a circular shape and each outer conductor (112, 212) is formed of a curved shape. When the conductive lines (113, 213) are connected to the center conductor (111, 211) and the outer conductors (112, 212), the thin conductive element (11, 21) is formed to an invert-S shape.

Since the center conductor (111, 211) and the outer conductor (112, 212) have smaller areas than that of the conventional thin conductive element in accordance with the prior art, surfaces of the center and outer conductors (111, 211) (112, 212) are hardly shrunk to an uneven face in the curing procedure of fabricating upper or lower board. Therefore, the center and outer conductors (111, 211) (112, 212) have even faces, the touching sensitivity of the thin film switch is stable.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A multi-layer printed circuit board for a keyboard, comprising:

an upper layer having multiple circular lines and a bottom;

a lower layer having multiple circular lines and a top;

an insulating separation layer positioned between the upper and lower layers and having multiple through holes, a top side and a bottom side;

multiple thin film switches each of which has two thin conductive elements formed on the upper layer and the lower layer, and aligned with one of the through holes in the insulating separation layer; and multiple spacers positioned between one of the upper and lower layers and the insulating separation layer, wherein each spacer corresponds to one of the through holes.

2. The multi-layer printed circuit board as claimed in claim 1, wherein the multiple spacers are formed on the bottom of the upper layer, and each spacer is mounted around a corresponding thin conductive element.

3. The multi-layer printed circuit board as claimed in claim 1, wherein the multiple spacers are formed on the top side of the insulating separation layer and respectively around the through holes.

4. The multi-layer printed circuit board as claimed in claim 1, wherein the multiple spacers are formed on the top of the lower layer, and each spacer is mounted around a corresponding thin conductive element.

5. The multi-layer printed circuit board as claimed in claim 1, wherein the multiple spacers are formed on the bottom side of the insulating separation layer and respectively around the through holes.

6. The multi-layer printed circuit board as claimed in claim 1, wherein each thin conductive element comprises:

a center conductor aligned with a corresponding through hole in the insulating separation layer;

at least two outer conductors formed adjacent to the center conductor and aligned with the corresponding through hole in the insulating separation layer, wherein each outer conductor is connected to one of the circuit lines on a corresponding one of the upper and lower boards; and at least two conductive lines connected to the at least two outer conductors and connected to the center conductor.

7. The thin film switch as claimed in claim 6, wherein the two outer conductors of each thin conductive element are symmetrically formed adjacent to a corresponding center conductor and are formed in a curved shape.

8. The thin film switch as claimed in claim 7, wherein each thin conductive element is formed in an inverted S-shape.

9. A multi-layer printed circuit board of a keyboard, comprising:

an upper layer having multiple circular lines and a bottom;

a lower layer having multiple circular lines and a top;

an insulating separation layer positioned between the upper and lower layers, having multiple through holes, a top side and a bottom side;

multiple thin film switches each of which has two thin conductive elements formed on the upper layer and the lower layer, and aligned with one of the through holes; and multiple spacers positioned among the upper layer, the lower layers and the insulating separation layer, wherein each spacer corresponds to one of the through holes.

10. The multi-layer printed circuit board as claimed in claim 9, wherein the multiple spacers are formed on the bottom of the upper layer and the top of the lower layer, and each of the spacers is adjacent to a corresponding thin conductive element.

11. The multi-layer printed circuit board as claimed in claim 9, wherein the multiple spacers are formed on top and bottom sides of the insulating separation layer, and each of which is mounted around a corresponding through hole.

12. The multi-layer printed circuit board as claimed in claim 9, wherein each thin conductive element comprises:

a center conductor aligned with a corresponding through hole in the insulating separation layer;

at least two outer conductors formed adjacent to the center conductor and aligned with a corresponding through hole, wherein each outer conductor is connected to one of the circuit lines on a corresponding one of the upper and lower boards; and at least two conductive lines connected respectively to the at least two outer conductors and connected to the center conductor.

13. The thin film switch as claimed in claim 12, wherein the two outer conductors of each thin conductive element are symmetrically formed adjacent to a corresponding center conductor and are formed in a curved shape.

14. The thin film switch as claimed in claim 13, wherein each thin conductive element is formed toll in an inverted S-shape.

* * * * *